(12) United States Patent
Chambion

(10) Patent No.: US 10,845,405 B2
(45) Date of Patent: Nov. 24, 2020

(54) INTEGRATED CIRCUIT INTENDED FOR INSULATION DEFECT DETECTION AND HAVING A CONDUCTIVE ARMATURE

(71) Applicant: COMMISSARIAT A L'ENERGIE ATOMIQUE ET AUX ENERGIES ALTERNATIVES, Paris (FR)

(72) Inventor: Bertrand Chambion, Pontcharra (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 23 days.

(21) Appl. No.: 16/066,142

(22) PCT Filed: Dec. 15, 2016

(86) PCT No.: PCT/FR2016/053468
§ 371 (c)(1),
(2) Date: Jun. 26, 2018

(87) PCT Pub. No.: WO2017/115027
PCT Pub. Date: Jul. 6, 2017

(65) Prior Publication Data
US 2019/0369157 A1    Dec. 5, 2019

(30) Foreign Application Priority Data

Dec. 28, 2015 (FR) .................................... 15 63404

(51) Int. Cl.
*G01R 31/26* (2020.01)
*G01R 31/28* (2006.01)
(Continued)

(52) U.S. Cl.
CPC ..... *G01R 31/2635* (2013.01); *G01R 31/2839* (2013.01); *G09G 3/006* (2013.01); *G09G 3/32* (2013.01)

(58) Field of Classification Search
None
See application file for complete search history.

(56) References Cited

U.S. PATENT DOCUMENTS

2009/0287426 A1* 11/2009 Kukowski .............. G01R 31/58
                                                         702/35
2013/0323903 A1    12/2013 Fenouillet-Beranger et al.
(Continued)

FOREIGN PATENT DOCUMENTS

EP    2669939 A1    12/2013
FR    2782842 A1    3/2000
(Continued)

OTHER PUBLICATIONS

International Search Report dated Apr. 5, 2017, in PCT/FR2016/053468, filed Dec. 15, 2016.

*Primary Examiner* — Jas A Sanghera
(74) *Attorney, Agent, or Firm* — Oblon, McClelland, Maier & Neustadt, L.L.P.

(57) ABSTRACT

An electronic circuit including: an electronic component, a conductive armature surrounding the electronic component, an electrical insulator between the electronic component and the conductive armature, a device configured to measure current passing through the armature or voltage on the armature or on the electronic component, and a defect determination device configured to determine a defect in the electrical insulator based on the measured current or voltage.

13 Claims, 4 Drawing Sheets

(51) Int. Cl.
*G09G 3/00* (2006.01)
*G09G 3/32* (2016.01)

(56) References Cited

U.S. PATENT DOCUMENTS

| | | |
|---|---|---|
| 2014/0084941 A1 | 3/2014 | Yun et al. |
| 2014/0191291 A1 | 7/2014 | La Rosa et al. |
| 2015/0021629 A1 | 1/2015 | Gershowitz et al. |
| 2015/0022088 A1 | 1/2015 | Gershowitz et al. |
| 2015/0022101 A1 | 1/2015 | Gershowitz et al. |
| 2015/0054406 A1 | 2/2015 | Gershowitz et al. |
| 2015/0145415 A1 | 5/2015 | Gershowitz et al. |
| 2015/0155331 A1 | 6/2015 | Guenard |
| 2015/0377466 A1 | 12/2015 | Gershowitz et al. |
| 2016/0255690 A1 | 9/2016 | Gershowitz et al. |

FOREIGN PATENT DOCUMENTS

| | | |
|---|---|---|
| FR | 2964793 A1 | 3/2012 |
| FR | 3009474 A1 | 2/2015 |

\* cited by examiner

INTEGRATED CIRCUIT INTENDED FOR INSULATION DEFECT DETECTION AND HAVING A CONDUCTIVE ARMATURE

The invention relates to electronic circuits including conductive grids or frames and, in particular, to electronic circuits allowing a malfunction caused by a fault in the electrical insulator between an electronic component of the electronic circuit and a conductive grid encircling this component to be detected.

Electronic circuits including matrix arrays of light-emitting diodes or LEDs are known. Light-emitting diodes have undergone substantial development, in particular because of their low power consumption, their reputedly long lifetime, and their advantageous integrability into electronic circuits. The drawback of the integrability of such LEDs is that it prevents replacement of one LED cell in the matrix array. Moreover, a complete failure of an LED cell may affect the operation of all the other LED cells, with which it may be connected in series.

LED cells are known to malfunction in various modes, these malfunctions sometimes being specific to the technology used to manufacture the LED cells. A gradual degradation is observed to occur, the leakage current at the junctions of the diodes or through insulating layers in particular increasing. Thus, even if an LED cell remains functional, the light flux that it emits gradually decreases for a given voltage level applied across its terminals.

To address these problems, in particular with regard to meeting safety standards, there is a need for a solution for monitoring, beforehand, the operation of LED cells. Moreover, the analysis of the mode of malfunction is sometimes quite incomplete.

Document US2015/0021629 describes fastening a matrix array of LEDs to the substrate of a control module, and thus forming an electronic circuit. The LEDs are soldered to a rectangular conductive metal plate. The LEDs therefore make electrical contact with this metal plate. The voltage of the LEDs is measured to determine a gradual shift in voltage level, in order to guarantee a brightness level.

This document does not allow optimal insulation of the LEDs to be guaranteed, or a fault in the insulation of these LEDs to be detected.

Document FR3009474 describes a matrix array of series/parallel LEDs. In order to prevent the lights of a vehicle from malfunctioning, a functional failure of an LED is detected, then the latter is short-circuited by a current source that guarantees current is balanced between various parallel branches. The turn-on of the remaining LEDs in a branch including a failed LED is ensured. This document thus describes detecting a failure via analysis of the voltage across the terminals of an LED.

This document does not allow an optimal insulation of the LEDs to be guaranteed, or a fault in the insulation of these LEDs to be detected.

Document US2014/0084941 describes a matrix array of LEDs for a screen, said matrix array being equipped with devices for testing for malfunction. The document describes a detection line DFL that is laterally offset with respect to the LEDs. An electrical insulator is interposed between the detection line and the supply lines of the pixels.

This document does not allow an optimal insulation of the LEDs to be guaranteed, nor a fault in the insulation of these LEDs or between these LEDs to be detected.

The invention aims to solve one or more of these drawbacks. The invention thus relates to an electronic circuit, such as defined in appended claim 1.

The invention also relates to the variants detailed in the dependent claims. Those skilled in the art will understand that each of the features of the variants of the dependent claims may be combined independently with the features of claim 1, without however constituting an intermediate generalization.

The invention also relates to a method for determining a fault in an electrical insulator, such as defined in the appended claims.

Other features and advantages of the invention will become more clearly apparent from the description that is given thereof below, by way of completely nonlimiting indication, with reference to the appended drawings, in which.

Figure 1:
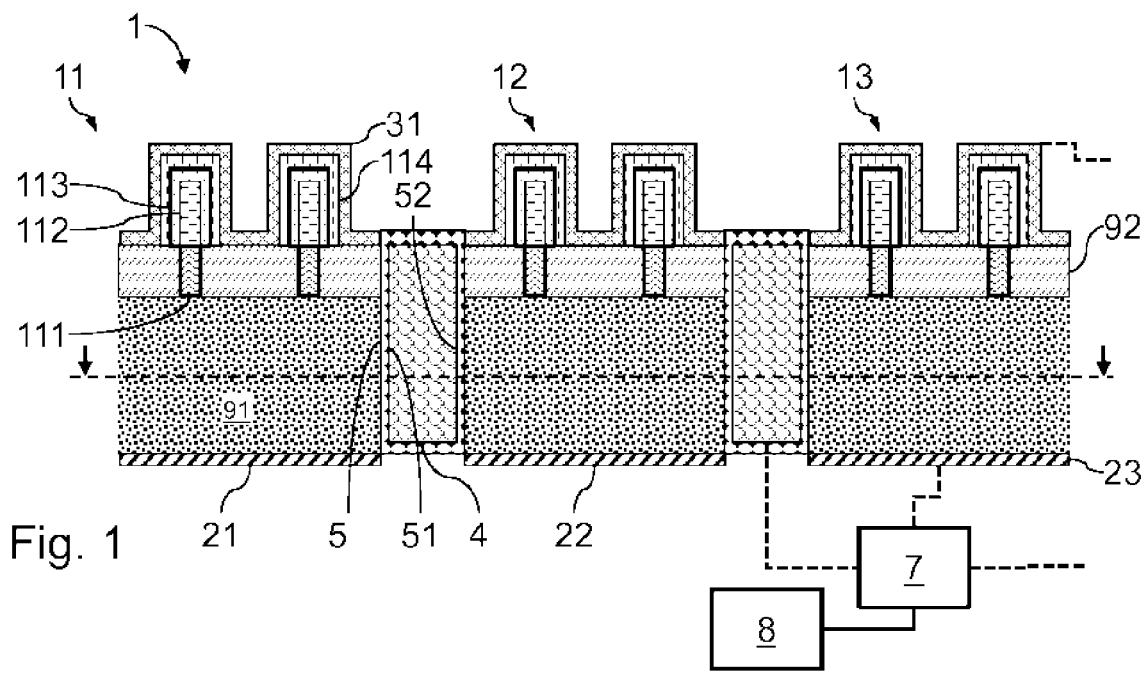
FIG. 1 is a cross-sectional side view of an integrated circuit according to one example embodiment of the invention.
Figure 2:
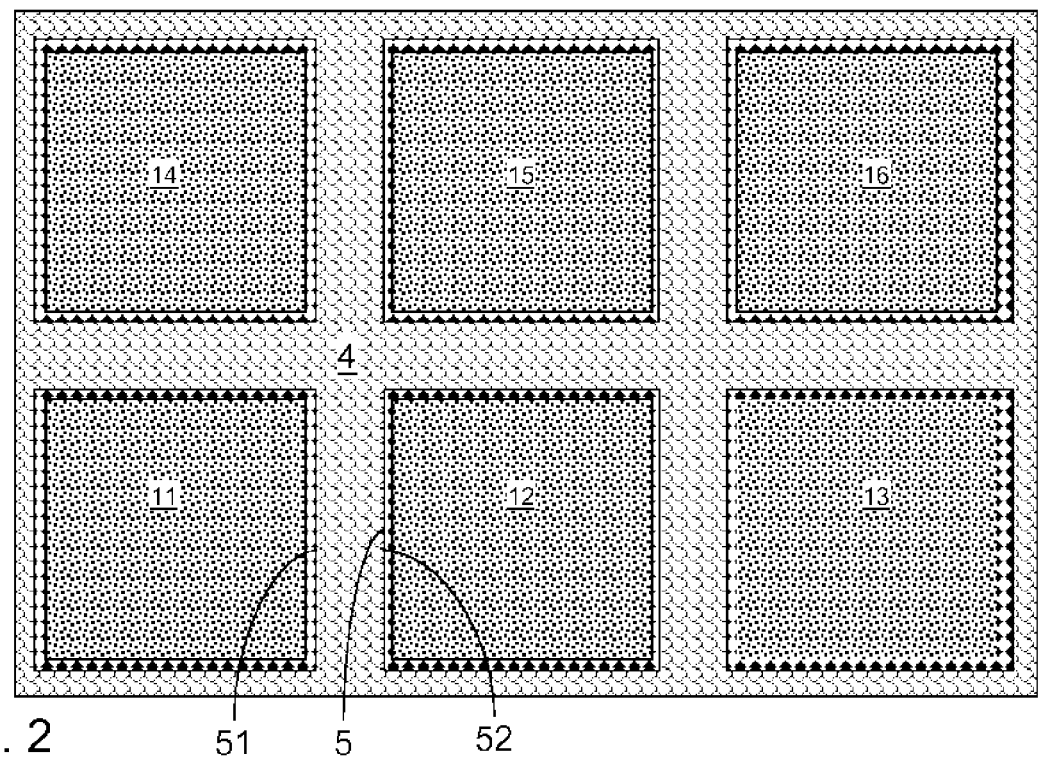
FIG. 2 is a cross-sectional top view of the integrated circuit of FIG. 1.

FIGS. 1 and 2 are cross-sectional views of an example integrated circuit 1 according to an example embodiment of the invention. The integrated circuit 1 comprises a plurality of electronic components 11 to 16, in the present case nanowire light-emitting diodes or LEDs. Each of the LEDs 11 to 16 forms an emissive pixel. The LEDs 11 to 16 are here formed in and on a semiconductor substrate 91. The substrate 91 is divided into various portions that are separated by vertical trenches. The vertical trenches here pass right through the substrate 91, so that the various portions of the substrate 91 are physically separated from one another. The various portions of the substrate 91 correspond to respective LEDs 11 to 16.

The integrated circuit 1 furthermore comprises a conductive grid 4 encircling the LEDs 11 to 16. The conductive grid 4 is at least partially housed in the separating trenches between the various portions of the substrate 91. The integrated circuit 1 furthermore comprises an electrical insulator 5. The electrical insulator 5 is at least partially housed in the separating trenches between the various portions of the substrate 91. The electrical insulator 5 in particular covers the lateral faces of the various portions of the substrate 91. Thus, in cross section in the plane of the substrate 91, between two portions of the substrate 91, there is a layer of electrical insulator 5, the grid 4, and another layer of the electrical insulator 5. The electrical insulator 5 on the one hand forms an electrical insulation between the grid 4 and the LEDs 11 to 16. A lateral face 51 of the electrical insulator 5 in particular forms a separation between the LED 11 and the grid 4. A lateral face 52 of the electrical insulator 5 forms a separation between the LED 12 and the grid 4. The electrical insulator 5 on the other hand forms an electrical insulation between the various LEDs 11 to 16.

The LEDs 11 to 16 may have a structure that is known per se. The LEDs 11 to 16 here include respective electrodes, which are positioned under the substrate 91. The LEDs 11 to 13 respectively include bottom electrodes 21 to 23 that are placed under their respective portion of the substrate 91, and that are typically made of metal. The substrate 91 is made of a semiconductor. The substrate 91 is for example sufficiently doped to be conductive. The material of the substrate 91 may be selected so as to promote organized growth of LED nanowires. The substrate 91 is surmounted with an insulating layer 92. This insulating layer 92 is for example made of silicon oxide or of silicon nitride. This layer 92 may typically have a thickness comprised between 25 nm and 25 μm.

Each of the LEDs 11 to 16 includes a plurality of pads 111 that pass through the thickness of the insulating layer 92. The pads 111 are intended to conduct the respective biases of the bottom electrodes to the wires of the various LEDs 11 to 16. The pads 111 are for example made of a III-N alloy, GaN for example. The pads 111 may for example be made of unintentionally doped GaN or of n-doped GaN.

A respective wire is formed plumb with each of the pads 111. The structure of the wires will be described with reference to the LED 11, the LEDs 12 to 16 possibly having a similar structure. A wire comprises an upright 112 that makes contact with a pad 111 via its bottom portion. The upright 112 may be produced, in a way known per se, from a III-N alloy, n-doped or unintentionally doped GaN for example. The upright 112 is covered, in a way known per se, by a quantum well structure 113. The structure 113 here includes an alternation of layers (for example an alternation of layers of undoped GaN and of layers of InGaN). Most of the light radiation of the LED is generated in the quantum well structure 113. The quantum well structure 113 is covered, in a way known per se, by a layer 114, for example made of p-doped GaN, so as to form a p-n or p-i-n junction with the upright 112 or the quantum well 113.

The wires of the LED 11 are covered with a conductive layer 31 forming a top electrode. The layer 31 is conductive in order to be able to electrically bias each p-n junction. The conductive layer 31 is transparent at the emission wavelength of the LED 11. The layer 31 may be produced, in a way known per se, from indium tin oxide (usually denoted by the acronym ITO) or of aluminum-doped zinc oxide.

A supply circuit (not shown) allows a potential difference of a suitable amplitude to be selectively applied across the bottom electrode 21 and the layer 31 of the common top electrode, in order to make the LED 11 emit light.

The electronic circuit 1 according to the invention includes a device 7 that is configured to measure the current flowing through the grid 4, and/or the voltage across this grid 4 or on each of the LEDs 11 to 16. The device 7 is for example implemented in the form of a microcontroller.

The electronic circuit 1 furthermore includes a device 8, which is connected to the device 7. The device 8 is configured to determine a fault in the electrical insulator 5 depending on the voltage or on the current measured by the device 7. As detailed more precisely in the practical examples that follow, the device 8 may thus anticipate or observe a malfunction of the electronic circuit 1. The device 8 is for example implemented in the form of a microcontroller.

In the particular example illustrated, the conductive grid 4 is advantageously made of doped polysilicon. The polysilicon may for example be doped with a concentration at least equal to $10^{19}$ cm$^{-3}$, preferably at least equal to $5\times10^{19}$ cm$^{-3}$, with a view to forming a grid 4 with little residual thermomechanical stress post manufacture. Such a doped polysilicon thus forms an inexpensive filling material for the grid 4. The doped polysilicon exhibits similar mechanical properties to those of the doped silicon substrate 91 (which for example has a dopant concentration of the same order of magnitude as the grid 4) during a temperature rise. In such a configuration, the mechanical stresses exerted on the grid 4 are lower during a temperature rise, for example a temperature rise related to the formation of silicon-oxide layers by thermal oxidation, or during an anneal of a layer of the LEDs, or in any other step of a manufacturing process involving high temperatures and potentially generating mechanical stresses between the grid 4 and the substrate 91.

Figure 3:
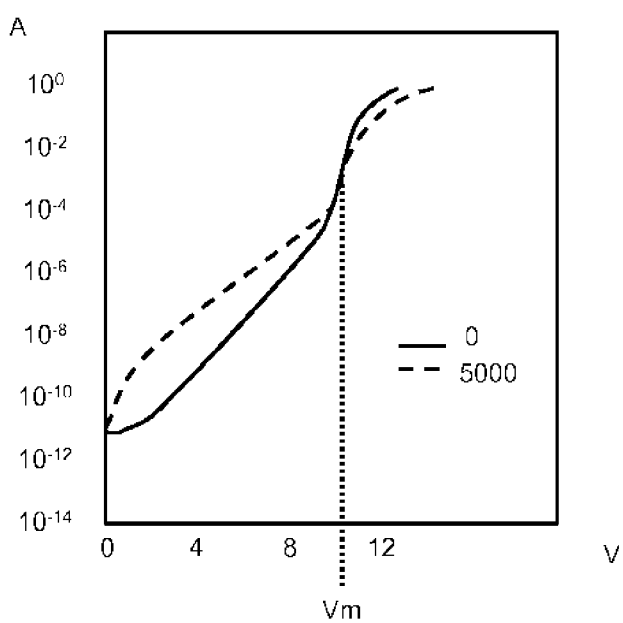
FIG. 3 is a current/voltage graph illustrating the aging of an LED made up of multiple series-connected chips, said aging being partially related to a degradation of the insulator.

FIG. 3 is a graph that is representative of an example of aging of an LED made up of multiple series-connected chips. The y-axis of the graph represents the current flowing through the LED, and the x-axis the potential difference applied across the terminals of the LED. The voltage Vm corresponds to the minimum voltage allowing spontaneous emission (light emission) to be stimulated in the junction of the LED. The solid curve corresponds to a new LED and the dashed curve corresponds to an LED after 5000 hours of operation.

The potential difference Vm corresponds to the minimum voltage required to turn on the light-emitting diode. It will generally be noted that the current flowed for a bias lower than Vm increases as a function of time. It will be noted that the leakage current flowing through the LED, supplied with a potential difference lower than Vm, is very much higher for the LED that has been used for a certain length of time. An insulation fault with a conductive grid 4 encircling the LED may be an important factor in such a leakage current.

The structure illustrated in FIGS. 1 and 2 may for example be used to connect the LEDs 11 to 16 in series, in parallel, or in a time-multiplexed matrix array, depending on the interconnections produced between the various electrodes of these LEDs 11 to 16.

Figure 4A:
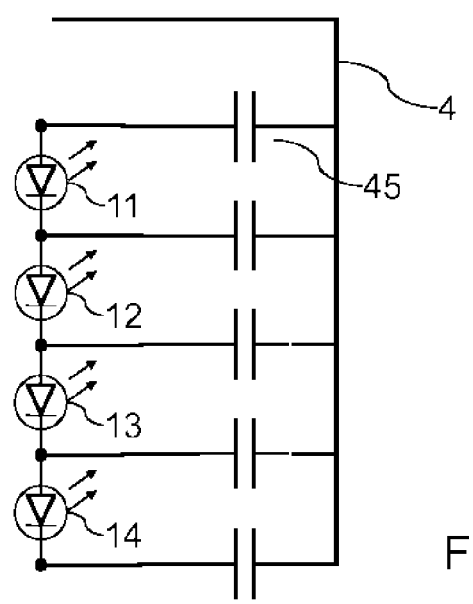
FIGS. 4a and 4b are equivalent circuit diagrams of an association of LEDs connected in series and of a grid, in the case of normal operation, and in the case of a short-circuit to the grid.
Figure 4B:
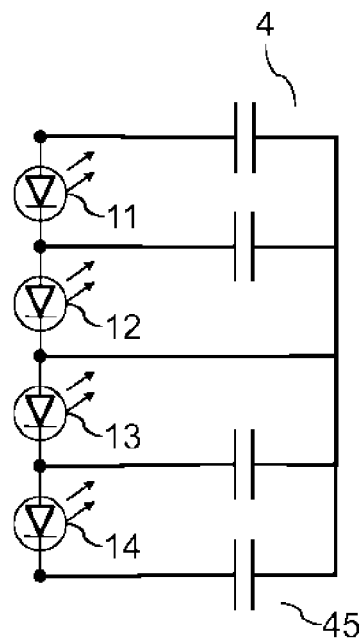

FIGS. 4a and 4b are equivalent circuit diagrams of a plurality of series-connected LEDs 11 to 14. The grid 4 may be likened to a first conductive plate of a plurality of capacitors 45. The insulator 5 of the grid 4 may be modeled as the insulator of these capacitors 45. Each connection node between the LEDs may be likened to a second conductive plate of the capacitors 45.

As illustrated in FIG. 4a, in normal operation, the grid 4 (and therefore the first conductive plates of the capacitors 45) is placed at a floating potential. The first conductive plates of the capacitors 45 are thus insulated from the second conductive plates by way of the insulator 5.

FIG. 4b illustrates an example malfunction, embodied by a short circuit between the grid 4 and the connection node of the LEDs 12 and 13. The grid 4 is then raised to the potential of this connection node.

The grid 4 must therefore have a floating potential in normal operation. This floating potential must have a value corresponding to the average of the potentials applied across the terminals of the LEDs. In case of a hard short circuit through the insulator 5, between the grid 4 and an LED (more precisely its substrate or one of its electrodes), the grid 4 then takes the potential of this LED. The device 7 is connected to the grid 4 and measures the potential of the grid 4. The device 7 delivers the measured potential to the device 8. Depending on the value of the potential measured by the device 7, the device 8 may:

determine an abnormal deviation of the floating potential, representative of a fault in the insulator 5;

locate in which LED the insulator 5 has a fault as to induce a connection to the grid 4.

The LED in which the insulator 5 presents a fault may be located as follows: if p is the number of series-connected LEDs and if Vf is the turn-on potential difference applied across each LED, it may be deduced therefrom that the potential difference applied across all of the series chain of the LEDs is Vin=p×Vf. In normal operation, the grid 4 is at a floating potential V4≈Vin/2.

If the measured potential Vm has this value V4, the device 8 determines that the grid 4 is at its normal potential and therefore that a priori the insulator 5 does not contain a fault.

If the measured potential Vm differs significantly from V4, the device 8 determines that the insulator 5 contains a fault. The position of the faulty LED in the chain of series-connected LEDs is identified by an index k, this position of index k being determined via a scale starting at ground potential and increasing to the potential Vin. The index k is defined by k=Vm/Vf, the determined value of k being rounded to the nearest integer.

With the potential Vm that is measured with the voltage Vin applied across the series chain of LEDs, it is possible to determine whether a fault has occurred during use of the LEDs. Such a test may also be carried out at the end of the manufacturing process, by applying the voltage Vin, with a view to avoiding having to carry out an optical inspection of the integrated circuit 1.

In the case where the measured voltage Vm is equal to V4, this measurement may either correspond to the floating potential of normal operation, or to an insulation fault in the LED of index k=p/2. In order to discriminate between these two particular cases, the variation of the voltage Vm may be analyzed dynamically during the application of a step in the voltage Vin to the chain of series-connected LEDs It is also possible to envision measuring a current flowing through the grid 4 to the measuring device 7. The amplitude of this current may be representative of the leakage impedance of the insulator 5, and therefore of the amplitude of the fault in the insulator 5.

Figure 5:
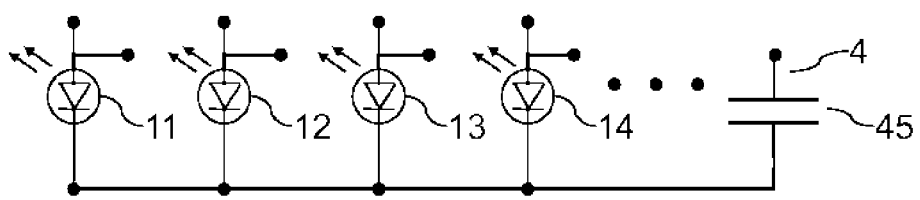
FIG. 5 is an equivalent circuit diagram of an association of LEDs connected in parallel and of a grid.

FIG. 5 is an equivalent circuit diagram of a plurality of LEDs that are connected in parallel in a matrix array, in the absence of malfunction. The grid 4, a common electrode of the LEDs 11 to 14 and the insulator 5 may be modeled as a capacitor 45. The grid 4 forms a conductive plate at a floating potential in normal operation.

The grid 4 must have a floating potential in normal operation. This floating potential must have a value Vf/2 corresponding to half the potential Vf applied across the terminals of the LEDs. In case of a hard short circuit through the insulator 5, between the grid 4 and an LED (more precisely its substrate or one of its electrodes), the grid 4 then takes the potential Vf or is grounded. The device 7 is connected to the grid 4 and measures the potential of the grid 4. The device 7 delivers the measured potential to the device 8. Depending on the value of the potential measured by the device 7, the device 8 may determine an abnormal deviation of the floating potential, representative of a fault in the insulator 5.

In the case of a matrix array of LEDs that are supplied in a time-multiplexed manner, a capacitor 45 is sequentially connected in parallel with each supplied LED. The test mode that will be described below may also be used for an integrated circuit 1 equipped with a set of parallel-connected LEDs, if this integrated circuit 1 is configured to sequentially supply each of the LEDs.

Figure 6:
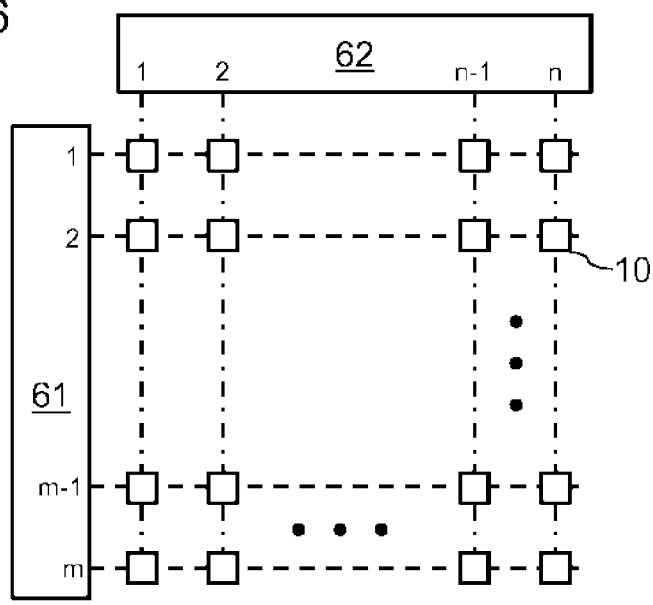
FIG. 6 illustrates components of a matrix array, said components being tested sequentially.

FIG. 6 illustrates a configuration of an integrated circuit 1 in which each LED 10 is connected to the intersection between a row line and a column line. Thus, each LED 10 includes an electrode that is connected to a row line and an electrode that is connected to a column line. A row control circuit 61 is connected to rows 1 to m. The control circuit 61 selectively applies a first supply potential (for example a ground potential) to one of the rows and keeps the other rows in a floating state. A column control circuit 62 is connected to columns 1 to n. The control circuit 62 selectively applies a second supply potential (the potential Vf) to one of the columns and keeps the other columns in a floating state.

Via suitable control of the control circuit 61 and 62, it is possible to sequentially test the insulation between each of the LEDs 10 and the grid 4. Thus, for each of the LEDs 10 supplied, it is possible to measure the potential Vm. By identifying whether the potential Vm is equal to Vf/2 or Vf for each of the LEDs 10, it is possible to determine whether its insulation with respect to the grid 4 has deteriorated or not. Since the position of the LED in the process of being supplied is known, the location of a possible fault in the insulator 5 is also known.

It is also possible to predict malfunction, for example by measuring a leakage current passing through the grid 4. Depending on the amplitude of the leakage current flowing through the grid 4, it is possible to anticipate an interruption of service of an LED or of the electronic circuit 1. Thus, if the amplitude of the leakage current exceeds a threshold, it may be determined that the remaining lifetime of an LED is low, and that, to meet safety standards, it must be replaced or preventive measures be taken.

Figure 7:
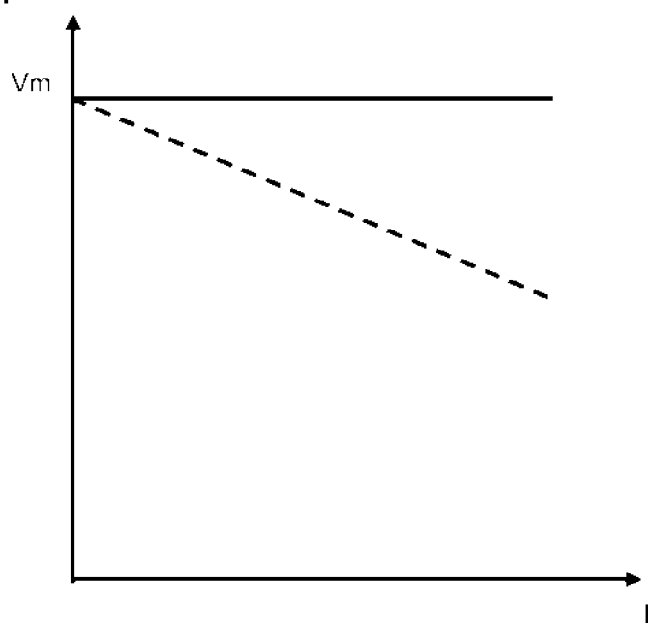
FIG. 7 is a graph illustrating various leakage-resistance cases.

FIG. 7 is a graph illustrating various cases of leakage resistances that may be determined. It is possible to envision for example determining the leakage resistance through the grid 4. Considering the grid 4 at its floating potential as a voltage source, it may be connected to ground successively by way of a plurality of different calibrated resistors, in order to calculate its internal resistance. By measuring the current drained from the grid 4 for these two values of resistance and by measuring the potential on the grid 4, it is possible to extrapolate graphs, such as illustrated, showing the potential Vm as a function of the drained current. The leakage resistance may be deduced from the slope of these characteristics. The solid curve for example corresponds to a leakage resistance of almost zero to the grid 4, i.e. to one hard short circuit between an LED and the grid 4. The dashed curve corresponds to a higher leakage resistance to the grid 4.

Figure 8:
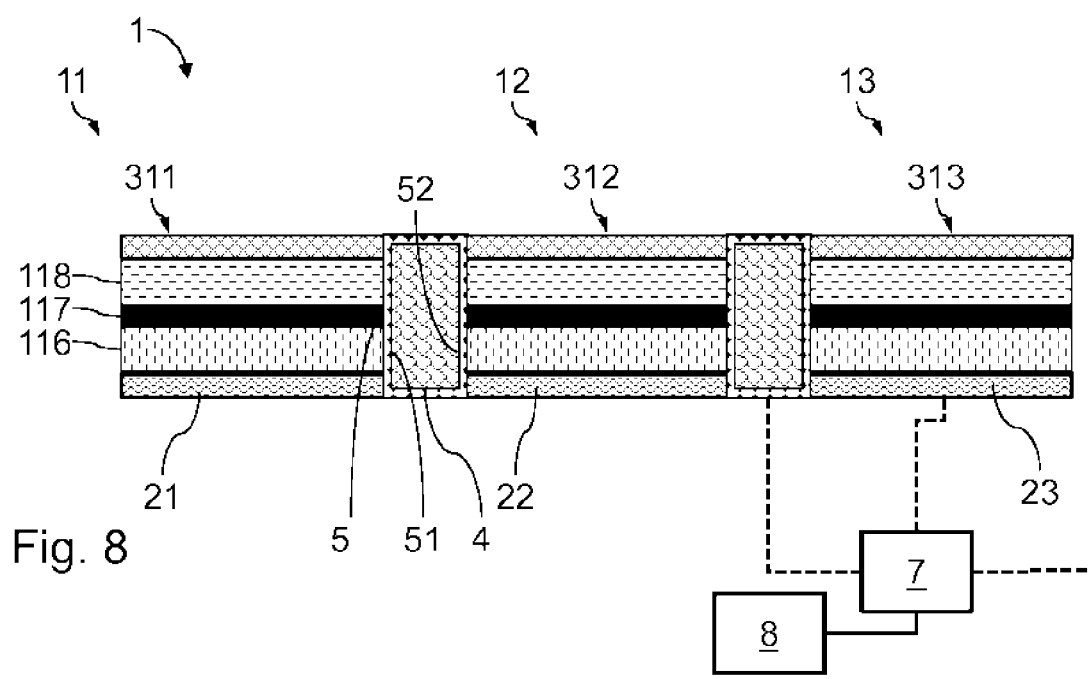
FIG. 8 is a cross-sectional side view of an integrated circuit according to another example embodiment of the invention.

The preceding embodiment was illustrated with reference to nanowire LEDs. FIG. 8 is a cross-sectional side view of an integrated circuit 1 according to another embodiment of the invention. The integrated circuit 1 comprises a plurality of LEDs with another design. Each of the LEDs 11 to 13 forms an emissive pixel.

The integrated circuit 1 furthermore comprises a conductive grid 4 encircling the LEDs 11 to 13. The integrated circuit 1 furthermore comprises an electrical insulator 5. The electrical insulator 5 on the one hand forms an electrical insulation between the grid 4 and the LEDs 11 to 13. A lateral face 51 of the electrical insulator 5 in particular forms a separation between the LED 11 and the grid 4. A lateral face 52 of the electrical insulator 5 forms a separation between the LED 12 and the grid 4. The electrical insulator 5 on the other hand forms an electrical insulation between the various LEDs 11 to 13.

The LEDs 11 to 13 may have a structure that is known per se. The LEDs 11 to 13 here include respective electrodes. The LEDs 11 to 13 respectively include bottom electrodes 21 to 23 that are typically made of reflective metal. The electrodes 21 to 23 are each covered with a p-doped semiconductor layer 116 (for example of p-doped GaN) with which they make contact. The semiconductor layer 116 is covered with an n-doped semiconductor layer 118 (for example of n-doped GaN). An active layer 117 is formed at the interface between the layers 116 and 118. The superposition of the layers 116 to 118 will here be likened to a substrate. The superposition of the layers 116 to 118 forming this substrate is divided into various portions that are separated by vertical trenches. The vertical trenches here pass right through the superposition of layers, so that the various portions of the substrate are physically separated from one another.

The conductive grid 4 is at least partially housed in the separating trenches between the various portions of the substrate. The electrical insulator 5 is at least partially housed in the separating trenches between the various portions of the substrate. The electrical insulator 5 in particular covers the lateral faces of the various portions of the superposition of layers 116 to 118. Thus, in cross section in the plane of the formed substrate, between two portions of the substrate, there is a layer of electrical insulator 5, the grid 4, and another layer of electrical insulator 5.

The active layer 117 may in particular comprise one or more quantum wells. The LEDs 11 to 13 include respective top electrodes, 311 to 313, that are formed in contact with the layer 118. The LEDs 11 to 13 may thus be biased by way of their respective top and bottom electrodes. The electrodes 311 to 313 are transparent at the emission wavelength of their respective LED. The electrodes 311 to 313 are for example made of indium tin oxide.

The electronic circuit 1 according to this embodiment also includes a device 7 that is configured to measure the current flowing through the grid 4, or the voltage across this grid 4 or on each of the LEDs 11 to 13. The device 7 is for example implemented in the form of a microcontroller.

The electronic circuit 1 furthermore includes a device 8, which is connected to the device 7. The device 8 is configured to determine a fault in the electrical insulator 5 depending on the voltage or on the current measured by the device 7. As detailed more precisely in the practical examples that follow, the device 8 may thus anticipate or observe a malfunction of the electronic circuit 1. The device 8 is for example implemented in the form of a microcontroller. The way in which a malfunction is identified and located may be similar to that described with reference to the first embodiment.

In order to anticipate a malfunction, the drift in the floating potential of the grid 4 prior to a malfunction will possibly also be evaluated.

In the examples detailed above, the grid 4 is at a floating potential. A potential may also be applied to the grid 4 and the current flowing therethrough determined.

In the context of tests on a manufacturing line, the measurements carried out will possibly be crossed with optical measurements with a view to refining the diagnosis of the malfunction.

Although the invention has been described with respect to a particular application to electronic components of the LED type, the invention is also applicable to any other type of segmented or pixelated electronic component containing a conductive grid that is electrically insulated from the matrix array of pixels.

The invention claimed is:

1. An electronic circuit, comprising:
a substrate, divided into plural portions by at least one vertical trench;
two electronic components formed in and on respective portions of the substrate and separated by the vertical trench;
a conductive grid at least partially housed in the trench, and encircling the two electronic components;
an electrical insulator at least partially housed in the trench between the electronic components and the conductive grid;
a device configured to measure current flowing through the grid or voltage across this grid; and
circuitry configured to determine a fault in the electrical insulator depending on the current or on the voltage measured.

2. The electronic circuit as claimed in claim 1, wherein the grid includes polysilicon having a dopant concentration at least equal to $10^{19}$ cm$^{-3}$.

3. The electronic circuit as claimed in claim 1, wherein the electronic components are light-emitting diodes.

4. The electronic circuit as claimed in claim 1, wherein the grid is at a floating potential.

5. The electronic circuit as claimed in claim 1, wherein the electrical insulator insulates each of the electronic components from the conductive grid and insulates the electronic components from one another.

6. The electronic circuit as claimed in claim 1, wherein the electronic components are electrically connected in series.

7. The electronic circuit as claimed in claim 1, wherein the electronic components are electrically connected in parallel.

8. The electronic circuit as claimed in claim 1, further comprising a supplying device configured to sequentially supply the electronic components with a same potential difference.

9. The electronic circuit as claimed in claim 1, wherein the vertical trench passes through an entire depth of the substrate.

10. A method for determining a fault in an electrical insulator, the method comprising:
providing an electronic circuit including an electrical insulator, electronic components, and a conductive grid encircling the electronic components, the electrical insulator being placed between the conductive grid and the electronic components;
measuring current flowing through the grid or voltage across the grid;
determining a fault in the electrical insulator depending on the current or on the voltage measured; and
locating a location of the fault depending on amplitude of the voltage or of the current measured,
wherein the provided electronic circuit comprises a supplying device that is configured to sequentially supply the electronic components with a same potential difference, and wherein the fault is located by measuring the voltage across the grid and by determining for which electronic component the measured voltage corresponds to a supply voltage of the electronic component.

11. The determining method as claimed in claim 10, wherein the grid of the electronic circuit is at a floating potential in absence of fault in the electrical insulator.

12. The determining method as claimed in claim 10, wherein the electronic components are electrically connected in series, and wherein the fault is located by comparing the measured voltage to supply voltages of the series-connected electronic components.

13. The determining method as claimed in claim 10, wherein the grid includes polysilicon having a dopant concentration at least equal to $10^{19}$ cm$^{-3}$.

* * * * *